US009046912B1

(12) United States Patent
Liu et al.

(10) Patent No.: US 9,046,912 B1
(45) Date of Patent: Jun. 2, 2015

(54) THERMALLY BALANCED PARALLEL OPERATION OF TRANSISTORS

(71) Applicant: The Boeing Company, Chicago, IL (US)

(72) Inventors: Shengyi Liu, Sammamish, WA (US); Lijun Gao, Renton, WA (US); Eugene V. Solodovnik, Lake Stevens, WA (US); Kamiar J. Karimi, Kirkland, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/187,886

(22) Filed: Feb. 24, 2014

(51) Int. Cl.
*H03K 17/62* (2006.01)
*G05F 1/625* (2006.01)

(52) U.S. Cl.
CPC ........................................ *G05F 1/625* (2013.01)

(58) Field of Classification Search
CPC .................................. G05F 1/10; G05F 1/462
USPC .......................... 327/403, 404, 405, 512, 513
See application file for complete search history.

(56) References Cited

U.S. PATENT DOCUMENTS

| 5,434,527 | A | 7/1995 | Antone | |
|---|---|---|---|---|
| 6,806,772 | B2 | 10/2004 | Glaser et al. | |
| 7,265,601 | B2 | 9/2007 | Ahmad | |
| 7,521,985 | B2 * | 4/2009 | Ball et al. | 327/512 |
| 7,579,900 | B2 * | 8/2009 | Durbaum | 327/513 |
| 8,125,200 | B2 | 2/2012 | Tsai et al. | |
| 8,604,841 | B2 * | 12/2013 | Lobsiger et al. | 327/108 |

FOREIGN PATENT DOCUMENTS

| WO | WO 9013178 | 11/1990 |
|---|---|---|
| WO | WO 2012171938 | 12/2012 |
| WO | WO 2013138219 | 9/2013 |

\* cited by examiner

*Primary Examiner* — Jeffrey Zweizig
(74) *Attorney, Agent, or Firm* — Michael J. Baldauff, Jr.; Baldauff IP, LLC

(57) ABSTRACT

A system and method for prolonging and equalizing the effective life of a plurality of transistors operating in parallel. The temperature of each transistor is measured and compared with the average temperature of the transistor system. A temperature difference is determined between the average temperature of the transistors and the measured temperature of each of the transistors. The gate resistance and the gate emitter resistance of each transistor is varied based on the temperature differences to control the measured temperature of each transistors by controlling current through each transistor thereby thermally balancing the transistors.

26 Claims, 8 Drawing Sheets

THERMALLY BALANCED PARALLEL OPERATION OF TRANSISTORS

TECHNICAL FIELD

The field of the embodiments presented herein is thermally balancing parallel transistors and, more particularly, to adjusting current to each of the parallel transistors to equalize the operating temperatures and therefore achieve equal thermal degradation of the parallel transistors.

BACKGROUND

Transistor parameters such as on-resistance and gate capacitance are subject to the effects of temperature, aging, and defect. However, manufacturing differences result in transistor performance that varies from one another. Because each of the transistor performs differently, parallel operation of transistors may not have identical conditions. Therefore, manufacturing differences make it difficult to control the performance of each transistor in a parallel system relative to one another.

Typical parallel operation requires forcing each of the transistors to carry an equal amount of current or, in other words, each transistor carries the same load. Traditionally this is considered the best means of balancing temperature across a system of parallel transistors in an attempt to have each transistor in the system wear at the same rate. But balancing current may result in relative overloading of some transistors that have higher on-resistances, as a result of manufacturing differences, and therefore higher temperatures relative to other transistors that have lower on-resistances. The transistors associated with the higher temperatures wear and age more quickly.

Vehicles such as aircraft may have one or more engines requiring the use of a motor with a motor controller to start each engine. The motor controller includes multiple parallel transistors. Traditionally, motor controllers for aircraft are designed and built to handle maximum requirements regardless of its eventual use. For example, similarly designed motor controllers could drive a 100 kilowatt (kW) motor or a 50 kW motor. Therefore, most motor controller are overbuilt and underutilized. It is desirable to have a lighter and more flexible motor controller with parallel outputs capable of driving various motors. For example, multiple controllers could be combined in parallel to provide a customized and correctly sized control system where different controllers could be tasked according to the needs of the vehicle.

It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

According to one embodiment disclosed herein, an electronic circuit with temperature control is provided. The electronic circuit includes transistors configured to operate in parallel. Temperature sensors are thermally coupled to each of the transistors for producing a temperature output signal indicative of a measured temperature of each of the transistors. The electronic circuit also includes a controller for monitoring each temperature output signal of each of the temperature sensors and in response to the temperature outputs provide controller outputs to vary a gate resistance $R_G$ and a gate emitter resistance $R_{GE}$ associated with each of the transistors. The gate resistance $R_G$ and the gate emitter resistance $R_{GE}$ vary current to each of the transistors to thermally balance the transistors. In one or more configurations, the controller is configured to increase the gate resistance $R_G$ to one or more of the transistors in response to the temperature difference being greater than zero to decrease the measured temperature of one or more of the transistors and to decrease the gate emitter resistance $R_{GE}$ to the one or more transistors in response to the temperature difference being greater than zero to decrease the measured temperature of the one or more transistors. The controller may be further configured to decrease the gate resistance $R_G$ to one or more of the transistors in response to the temperature difference being less than zero to increase the measured temperature of the one or more transistors and to increase the gate emitter resistance $R_{GE}$ to the one or more transistors in response to the temperature difference being less than zero to increase the measured temperature of the one or more transistors.

According to another embodiment disclosed herein, a two transistor system having a temperature control system is provided. The two transistor system includes a first transistor and a second transistor configured to operate in parallel. The two transistor system also includes a first temperature sensor and a second temperature sensor. The first temperature sensor is thermally coupled to the first transistor for producing a first temperature output signal indicative of a first measured temperature of the first transistor. The second temperature sensor is thermally coupled to the second transistor for producing a second temperature output signal indicative of a second measured temperature of the second transistor. The two transistor system also includes a controller for monitoring the first and second temperature outputs and in response to the first and second temperature outputs provide controller outputs to vary a first gate resistance $R_{G1}$ and a first gate emitter resistance $R_{GE1}$ associated with the first transistor and to vary a second gate resistance $R_{G2}$ and a second gate emitter resistance $R_{GE2}$ associated with the second transistor. $R_{G1}$ and $R_{GE1}$ vary current to the first transistor and $R_{G2}$ and $R_{GE2}$ vary current to the second transistor to thermally balance the first and second transistors.

According to yet another embodiment disclosed herein, a method for prolonging and equalizing the effective life of a plurality of transistors is provided. The method includes operating the transistors in parallel and measuring a temperature of each of the transistors with a temperature sensor. The method also includes determining an average temperature of the transistors and determining a temperature difference between the average temperature of the transistors and the measured temperature of each of the transistors. The method then includes varying resistance based on the temperature differences to control the measured temperature of the transistors by controlling current through each of the transistors, thereby thermally balancing the transistors. In one or more configurations, the method includes increasing the gate resistance to one or more of the transistors in response to the temperature difference being greater than zero to decrease the measured temperature of the one or more transistors and decreasing gate emitter resistance to one or more of the transistors in response to the temperature difference being greater than zero to decrease the measured temperature of the one or more transistors. The method may also include decreasing gate resistance to one or more of the transistors in response to the temperature difference being less than zero to increase the measured temperature of the one or more of transistors and increasing gate emitter resistance to one or more transistors in response to the temperature difference being less than zero to increase the measured temperature of the one or more transistors.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

Figure 1:
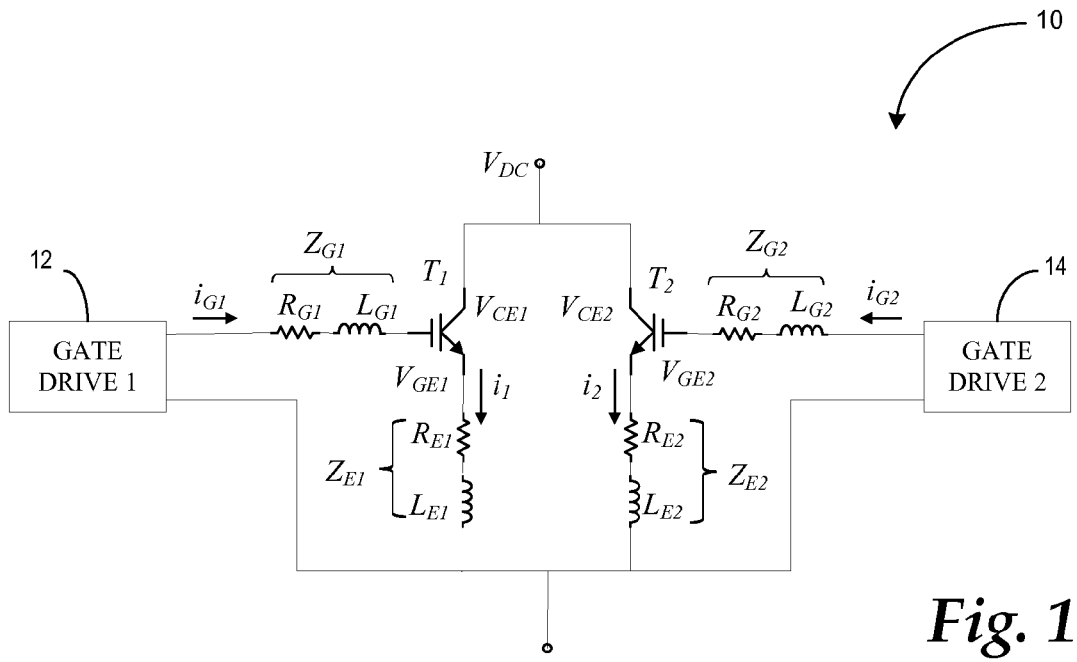
FIG. 1 illustrates two transistors operated in parallel wherein forced equal currents of the two transistors results in differing degrees of thermal degradation.

The plurality of figures presented in this application illustrates variations and different aspects of the embodiments of the present disclosure. Accordingly, the detailed description on each illustration will describe the differences identified in the corresponding illustration.

DETAILED DESCRIPTION

The following detailed description is directed to thermally balancing parallel transistors and, more particularly, to adjusting current to each of the parallel transistors to equalize the operating temperatures of each transistor and therefore achieve equal thermal degradation of the parallel transistors. The present disclosure is susceptible of embodiment in many different forms. Specifically, one or more configurations of electrical circuits control the operation of the transistors in parallel such that the temperature of each transistor is equal or substantially close to the temperature of other transistors. The temperature control of the transistor is achieved by controlling the current the transistor conducts such that the parallel transistors are always of the same thermal condition so that they achieve equal speed of wearing and ageing and, therefore, better thermal and health management for the transistor system.

There is no intent to limit the principles of the present disclosure to the particular disclosed embodiments. The transistor system may have any number of transistors in parallel. For example, an electronic circuit may include a two transistor system, three transistor system, etc. and the transistors may be any type. The transistors may be for example a Field-Effect Transistor (FET) such as a Junction Field-Effect Transistor (JFET), Metal-Oxide Semiconductor Field-Effect Transistor (MOSFET), or Insulated-Gate Field-Effect Transistor (IGFET), or be a bipolar transistor such as an Insulated-Gate Bipolar Transistor (IGBT). Switching control signals for the transistors may be generated by a logic circuit or a controller. In one or more confirmations, the parallel transistors are gate drive circuit implementations.

In the following detailed description, references are made to the accompanying drawings that form a part hereof and in which are shown by way of illustration specific embodiments or examples. Referring now to the drawings, in which like numerals represent like elements throughout the several figures, aspects of the present disclosure will be presented.

FIG. 1 illustrates an electronic circuit 10 having a DC input voltage $V_{DC}$ and a first transistor $T_1$ and a second transistor $T_2$ operated in parallel with gate drive 12 and gate drive 14, respectively. Loading of the currents $i_{G1}$ and $i_{G2}$ to the gates of transistor $T_1$ and transistor $T_2$, respectively, may be different because externally the impedances $Z_{G1}$ ($R_{G1}$ and $L_{G1}$) and $Z_{G2}$ ($R_{G2}$ and $L_{G2}$) of the drain to the source of the transistors $T_1$ and $T_2$ may be different. Also, the gate signals of transistors $T_1$ and $T_2$ may be different. Internally, the on-resistance and the gate capacitance of the transistors $T_1$ and $T_2$ may be different. The transistors $T_1$ and $T_2$ provide gate emitter voltages $V_{GE1}$ and $V_{GE2}$ with impedances $Z_{E1}$ ($R_{E1}$ and $L_{E1}$) and $Z_{E2}$ ($R_{E2}$ and $L_{E2}$) and, where the transistor currents $i_1$ and $i_2$ of the transistors $T_1$ and $T_2$ are forced equal, the temperatures of the transistors $T_1$ and $T_2$ are different. Therefore, the transistors $T_1$ and $T_2$ are subject to different degrees of thermal degradation and aging.

Figure 2:
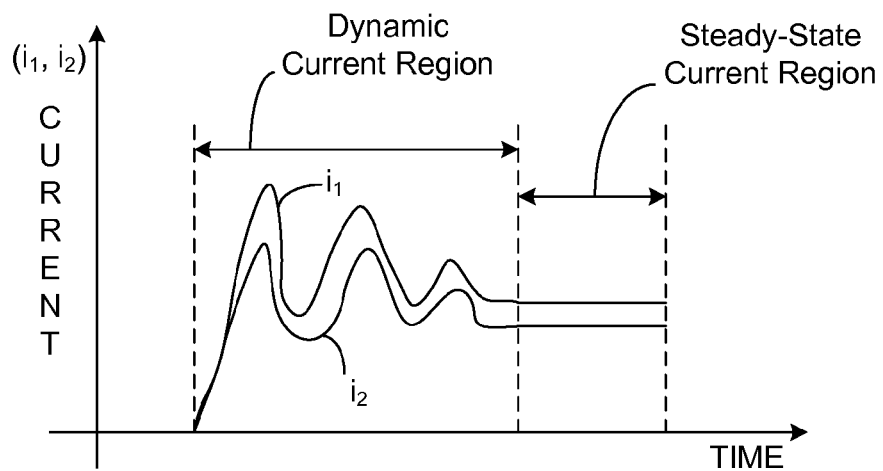
FIG. 2 illustrates portions of a switching waveform of the two transistors of FIG. 1 wherein the currents are not balanced.

FIG. 2 illustrates part of the switching wave forms of the transistors $T_1$ and $T_2$ of the electronic circuit 10 when the transistor currents $i_1$ and $i_2$ are not balanced. The behavior of transistor currents $i_1$ and $i_2$ in the dynamic region and the steady-state region are related to the different parameters as a result of the manufacturing of the transistors $T_1$ and $T_2$ of the electronic circuit 10. Based on the dissimilar waveforms of FIG. 2, better balancing of the thermal conditions between the transistors $T_1$ and $T_2$ requires better control of the parallel operation of the transistors $T_1$ and $T_2$.

Figure 3:
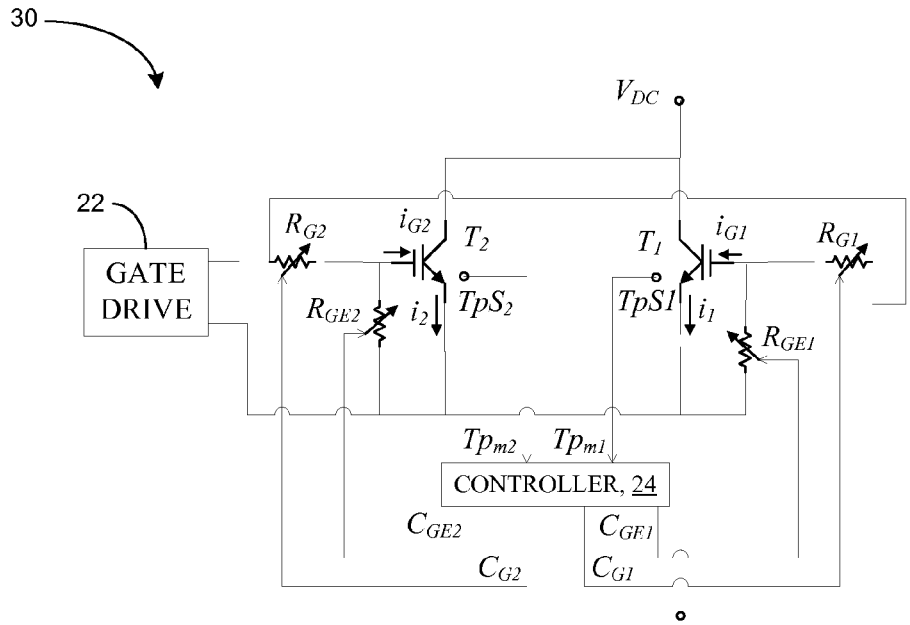
FIG. 3 illustrates one configuration of an electronic circuit with two parallel transistors utilizing a common gate drive and a controller for achieving equal thermal degradation according to at least one embodiment disclosed herein.

FIG. 3 illustrates an electronic circuit 30 utilizing one common gate drive 22 for supplying drive signals to transistors $T_1$ and $T_2$ and a controller 24 for achieving equal thermal degradation of the transistors $T_1$ and $T_2$. One or more other configurations may include separate and synchronized gate drives for supplying drive signals to transistors. The electronic circuit 30 also includes temperature sensors $T_pS_1$ and $T_pS_2$. Each of the temperature sensors $T_pS_1$ and $T_pS_2$ is thermally coupled to either of the transistors $T_1$ and $T_2$ and produces first and second temperature output signals indicative of a measured temperature $T_{pm1}$ of the transistor $T_1$ and a measured temperature $T_{pm2}$ of the transistor $T_2$. The controller 24 monitors each temperature output of each of the temperature sensors $T_pS_1$, $T_pS_2$. In response to the temperature outputs, the controller 24 provides controller outputs to vary the values of variable resistors. For example, in regard to transistor $T_1$, the controller 24 provides controller output $C_{G1}$ to vary the gate resistance $R_{G1}$ and provides controller output $C_{GE1}$ to vary the gate emitter resistance $R_{GE1}$. In regard to transistor $T_2$, the controller 24 provides controller output $C_{G2}$ to vary the gate resistance $R_{G2}$ and provides controller output $C_{GE2}$ to vary the gate emitter resistance $R_{GE2}$. The controller outputs $C_{G1}$, $C_{G2}$, $C_{GE1}$, and $C_{GE2}$ adjust a voltage across $R_{G1}$, a voltage across $R_{GE1}$, a voltage across $R_{G2}$, and voltage across $R_{GE2}$ and, therefore, the controller outputs $C_{G1}$, $C_{G2}$, $C_{GE1}$, and $C_{GE2}$ adjust a current across resistor $R_{G1}$, a current across resistor $R_{GE1}$, a current across resistor $R_{G2}$, and a current across resistor $R_{GE2}$. By changing the values of $R_{G1}$, $R_{G2}$, $R_{GE1}$, and $R_{GE2}$, the values of $V_{GE1}$, $V_{GE2}$, $i_{G1}$ and $i_{G2}$ are varied which leads to a change in transistor currents $i_1$ and $i_2$ in both the dynamic and steady-state regions to thermally balance the transistors $T_1$, $T_2$. When thermally balanced, the temperature of each of the transistors $T_1$, $T_2$ is substantially the same when the transistor currents $i_1$, $i_2$ conducted by the transistors $T_1$, $T_2$ are different. In other words, the transistors $T_1$, $T_2$ are thermally balanced when the transistor currents $i_1$, $i_2$ are unbalanced.

The controller 24 is configured to determine the measured temperatures $T_{pm1}$, $T_{pm2}$ of the transistors $T_1$, $T_2$ based on the temperature outputs provided by the temperature sensors $T_pS_1$, $T_pS_2$ from which an average temperature $Tp_{ave}$ of the transistors $T_1$, $T_2$ is determined. A temperature difference $\Delta Tp$ is calculated based on the difference between the average temperature $Tp_{ave}$ of the transistors $T_1$, $T_2$ and the measured temperature $T_{pm1}$, $T_{pm2}$ of each of the transistors $T_1$, $T_2$. The controller outputs $C_{G1}$, $C_{G2}$, $C_{GE1}$, and $C_{GE2}$ are provided based on the temperature difference $\Delta Tp$ of each of the transistors $T_1$, $T_2$. The controller 24 increases the gate resistance $R_{G1}$, $R_{G2}$ to one or more of the transistors in a transistor system, such as transistors $T_1$, $T_2$, in response to the temperature difference $\Delta Tp$ being greater than zero in order to decrease the measured temperature $T_{pm1}$, $T_{pm2}$ of the transistors $T_1$, $T_2$. The controller 24 also decreases the gate emitter resistance $R_{GE1}$, $R_{GE2}$ to one or more of the plurality of transistors in the transistor system, such as transistors $T_1$, $T_2$, in response to the temperature difference $\Delta Tp$ being greater than zero in order to decrease the measured temperature $T_{pm1}$, $T_{pm2}$ of the transistors $T_1$, $T_2$. The controller 24 decreases the gate resistance $R_{G1}$, $R_{G2}$ to transistors $T_1$, $T_2$ in response to the temperature difference $\Delta Tp$ being less than zero to increase the measured temperature $T_{pm1}$, $T_{pm2}$ of the transistors $T_1$, $T_2$. The controller 24 increases the gate emitter resistance to the transistors $T_1$, $T_2$ in response to the temperature difference $\Delta Tp$ being less than zero in order to increase the measured temperature $T_{pm1}$, $T_{pm2}$ of the transistors $T_1$, $T_2$.

Figure 4:
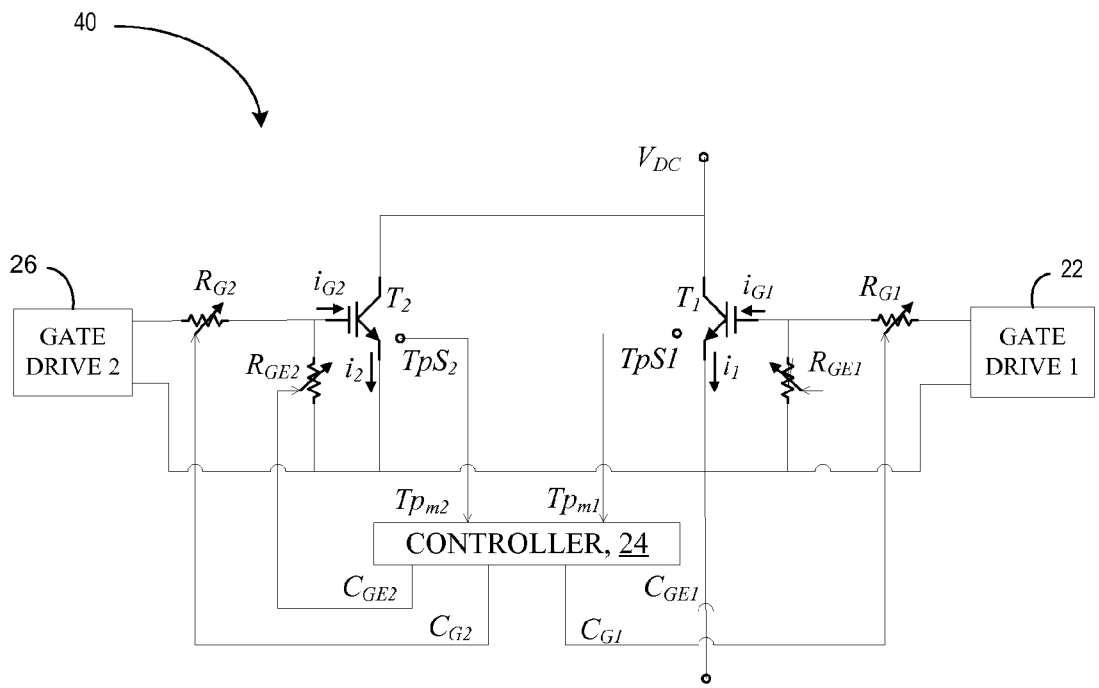
FIG. 4 illustrates one configuration of an electronic circuit with two parallel transistors utilizing separate gate drives and a controller for achieving equal thermal degradation according to at least one embodiment disclosed herein.
Figure 5:
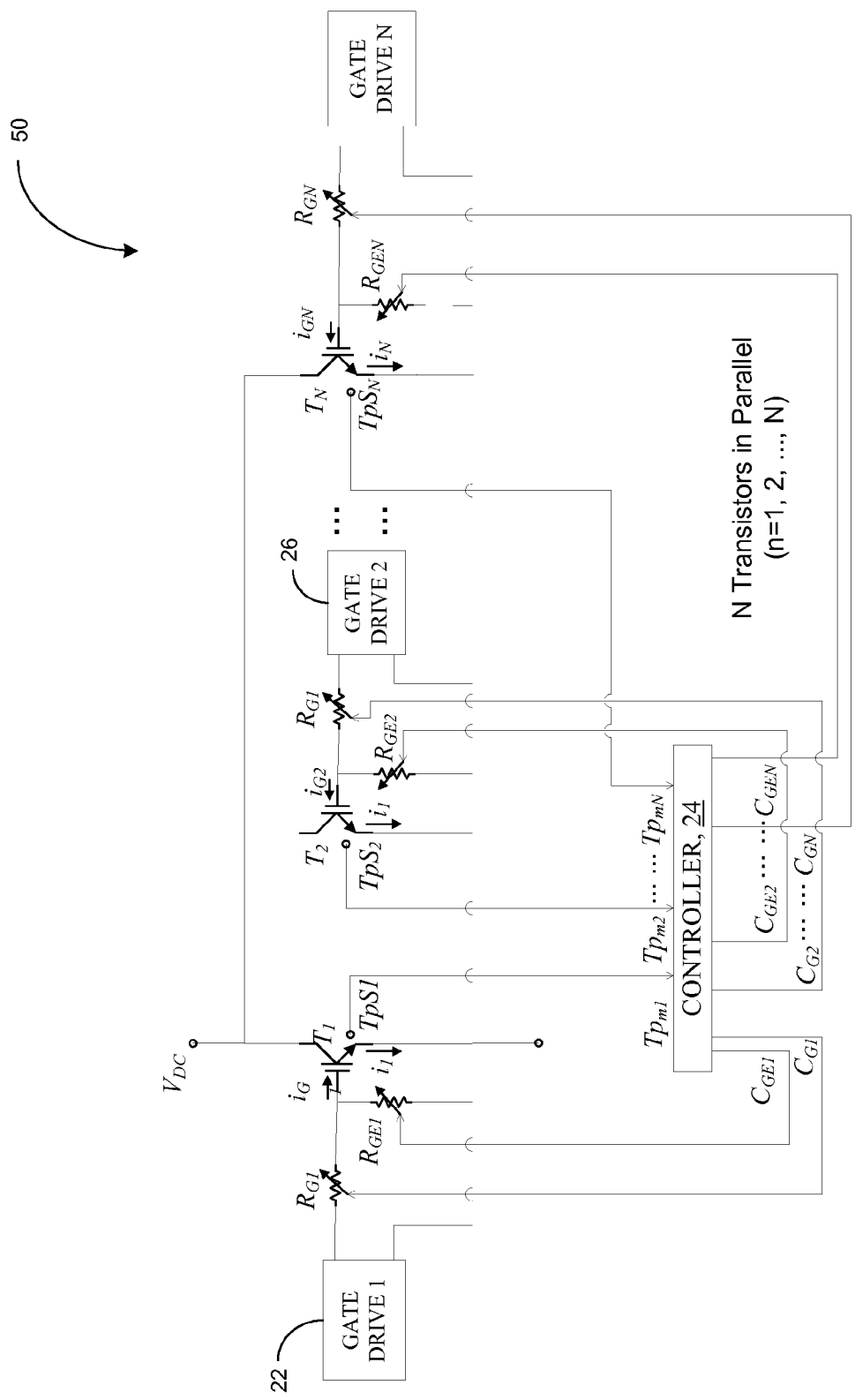
FIG. 5 illustrates one configuration of an electronic circuit with three or more parallel transistors utilizing separate gate drives and a controller for achieving equal thermal degradation according to at least one embodiment disclosed herein.

FIG. 4 illustrates an electronic circuit 40 utilizing separate and synchronized gate drives 22, 26 for supplying drive signals to transistors $T_1$, $T_2$ for achieving equal thermal degradation of the transistors $T_1$, $T_2$. Electronic circuit 40 is similar to electronic circuit 30 except for the use of the two gate drives 22, 26. FIG. 5 illustrates an electronic circuit 50 which is a configuration that expands upon the electronic circuit 40 of FIG. 4. Electronic circuit 50 includes three parallel transistors or more where N represents the number of parallel transistors. All the gate drives of the electronic circuit 50 are synchronized. The controller outputs $C_{G1}$, $C_{G2}$, ... $C_{GN}$, $C_{GE1}$, $C_{GE2}$, ... $C_{GEN}$ of controller 24 are provided based on the temperature difference $\Delta Tp$ of each of the transistors $T_1$, $T_2$, ... $T_N$. By changing the values of $R_{G1}$, $R_{G2}$, ... $R_{GN}$, $R_{GE1}$, $R_{GE2}$, ... $R_{GEN}$ the values of $V_{GE1}$, $V_{GE2}$, ... $V_{GEN}$, $i_{G1}$, $i_{G2}$, ... $L_{GN}$ are varied which leads to a change in transistor currents $i_1$, $i_2$, ... $i_N$ in both the dynamic and steady-state regions to thermally balance the transistors $T_1$, $T_2$, ... $T_N$.

Figure 6:
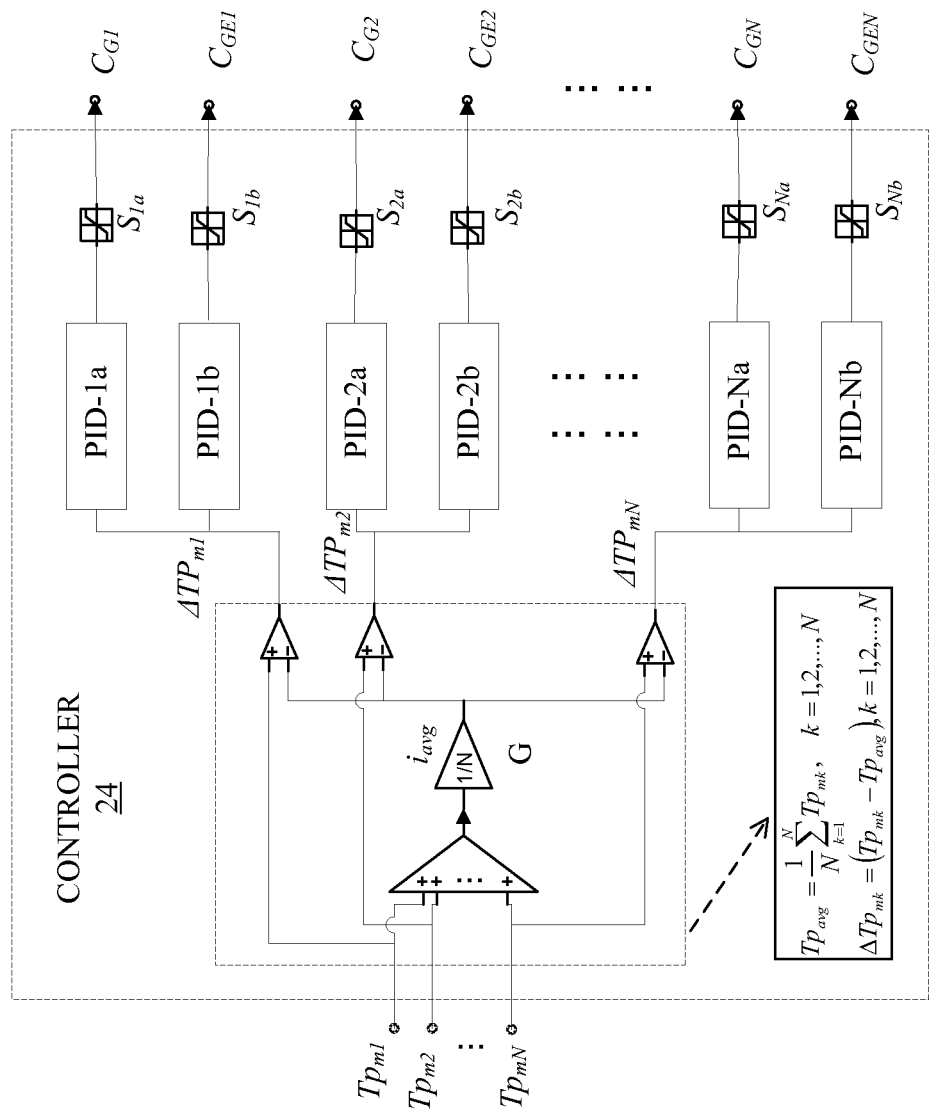
FIG. 6 illustrates one configuration of the controller for use with the parallel transistor systems according to at least one embodiment disclosed herein.

FIG. 6 illustrates one configuration of the controller 24. The measured temperature $Tp_{m1}$, $Tp_{m2}$, ... $Tp_{mN}$ is sensed by temperature sensors $TpS_1$, $TpS_2$, ... $TpS_N$. The average temperature $Tp_{avg}$ of the transistors $T_1$, $T_2$, ... $T_N$ in parallel is calculated by averaging the measured temperature $Tp_{m1}$, $Tp_{m2}$, ... $Tp_{mN}$. The temperature difference $\Delta Tp$ of each of the transistors $T_1$, $T_2$, ... $T_N$ is calculated by subtracting the measured temperature $Tp_{m1}$, $Tp_{m2}$, ... $Tp_{mN}$ of each of the transistors $T_1$, $T_2$, ... $T_N$ from the average temperature $Tp_{avg}$. The temperature differences $\Delta Tp_{m1}$, $\Delta Tp_{m2}$, ... $\Delta Tp_{mN}$ are then provided to proportional-integral-derivative (PID) controllers PID-1a, PID-1b, PID-2a, PID-2b, ... PID-Na, PID-Nb to generate the controller outputs $C_{G1}$, $C_{GE1}$, $C_{G2}$, $C_{GE2}$, ... $C_{GN}$, $C_{GEN}$, respectively. The controller outputs $C_{G1}$, $C_{GE1}$, $C_{G2}$, $C_{GE2}$, ... $C_{GN}$, $C_{GEN}$ control the values of $R_{G1}$, $R_{GE1}$, $R_{G2}$, $R_{GE2}$, ... $R_{GN}$, $R_{GEN}$ of each transistor $T_1$, $T_2$, ... $T_N$. Existing general PID controller technology can be applied here. The function of these PID controllers is to minimize the temperature differences $\Delta Tp_{m1}$, $\Delta Tp_{m2}$, ... $\Delta Tp_{mN}$ to close to zero through adjusting the output variables; therefore, the measured temperature $Tp_{m1}$, $Tp_{m2}$, ... $Tp_{mN}$ is track and equal to their average temperature, i.e., the temperature of transistors $T_1$, $T_2$, ... $T_N$ is controlled to equal to each other. The saturation block $S_{1a}$, $S_{1b}$, ..., $S_{Na}$, S is used to limit the PID output in pre-specified range.

Figure 7:
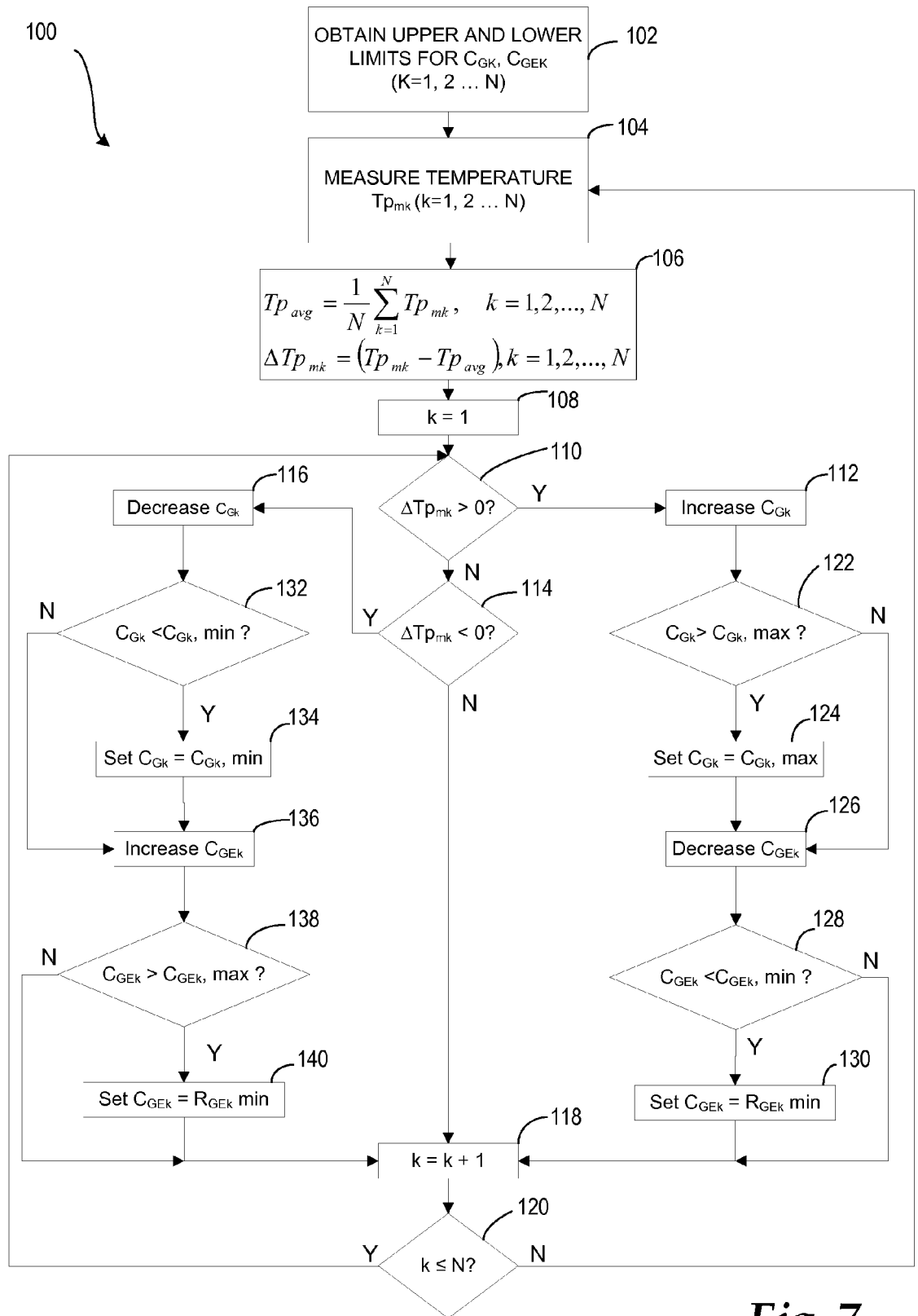
FIG. 7 illustrates one configuration of a flow chart for controlling the parallel transistor systems with the controller according to at least one embodiment disclosed herein.

FIG. 7 illustrates one configuration of a control flow chart 100 corresponding with the controller 24 of FIG. 6. The control flow chart 100 begins at block 102 with obtaining upper and lower limits for the controller outputs $C_{GK}$, $C_{GEK}$ where k=1, 2 ... N and where N equals the total number of parallel transistors in the transistor system. In block 104 the measured temperatures $Tp_{mk}$ for each transistor is determined and in block 106 the average temperature $Tp_{ave}$ of the group of transistors $T_1$, $T_2$, ... $T_N$ and the temperature differences $\Delta Tp_{mk}$ of each of the transistors are calculated. Block 108 initially assigns k=1 and at decision block 110 if $\Delta Tp$ is greater than zero then the control flow chart proceeds along the YES branch to block 112 where the controller output $C_{Gk}$ is increased and therefore increases the temperature of the particular transistor. At decision block 110 if $\Delta Tp_{mk}$ is not greater than zero than the control flow chart proceeds along the NO branch to decision block 114. At decision block 114 if $\Delta Tp_{mk}$ is less than zero then the control flow chart 100 proceeds along the YES branch to block 116 where the controller output $C_{Gk}$ is decreased and therefore decreases the temperature of the particular transistor. However, if $\Delta Tp_{mk}$ is not greater or less than zero than $\Delta Tp_{mk}$ should be about equal to zero which indicates that a particular transistor has a measured temperature $Tp_m$ that is about the same as the average temperature $Tp_{ave}$ of the system of transistors. In such case, the control flow chart 100 proceeds to block 118 to increment to the next transistor. From block 118 the control flow chart 100 proceeds to decision block 120 to determine whether k<N. If not, the process follows the NO branch back to block 104 where the measured temperatures $Tp_{mk}$ of the transistors $T_1$, $T_2$, ... $T_N$ are again determined to continually thermally balance the transistor system. In decision block 120 if k is less than or equal to N than the process loops back to just before the decision block 110 described above.

To increase the temperature of a transistor the controller output $C_{Gk}$ is increased as shown in block 112. Next, in decision block 122 if controller output $C_{Gk}$ is greater than controller output $C_{Gk}$, maximum then the YES branch is followed to block 124 where controller output $C_{Gk}$ is set equal to controller output $C_{Gk}$, maximum. If controller output $C_{Gk}$ is not greater than controller output $C_{Gk}$, maximum then the NO branch is followed to block 126 where controller output $C_{GEk}$ is decreased. In decision block 128, if controller output $C_{GEK}$ is less than $C_{GEk}$, minimum then the YES branch is followed to block 130 where controller output $C_{GEK}$ is set equal to $R_{GEk}$, minimum. From block 130 the process continues to block 118 described above. If controller output $C_{GEK}$ is not less than $C_{GEk}$, minimum then the NO branch is followed directly to block 118.

To decrease the temperature of a transistor the controller output $C_{Gk}$ is decreased as shown in block 116. Next, in decision block 132 if controller output $C_{Gk}$ is less than controller output $C_{Gk}$, minimum then the YES branch is followed to block 134 where controller output $C_{Gk}$ is set equal to controller output $C_{Gk}$, minimum. If controller output $C_{Gk}$ is not less than controller output $C_{Gk}$, minimum then the NO branch is followed to block 136 where controller output $C_{GEk}$ is increased. In decision block 138, if controller output $C_{GEK}$ is greater than $C_{GEk}$, maximum then the YES branch is followed to block 140 where controller output $C_{GEK}$ is set equal to $R_{GEk}$, minimum. From block 140 the process continues to block 118 described above. If controller output $C_{GEK}$ is not greater than $C_{GEk}$, maximum then the NO branch is followed directly to block 118.

Figure 8:
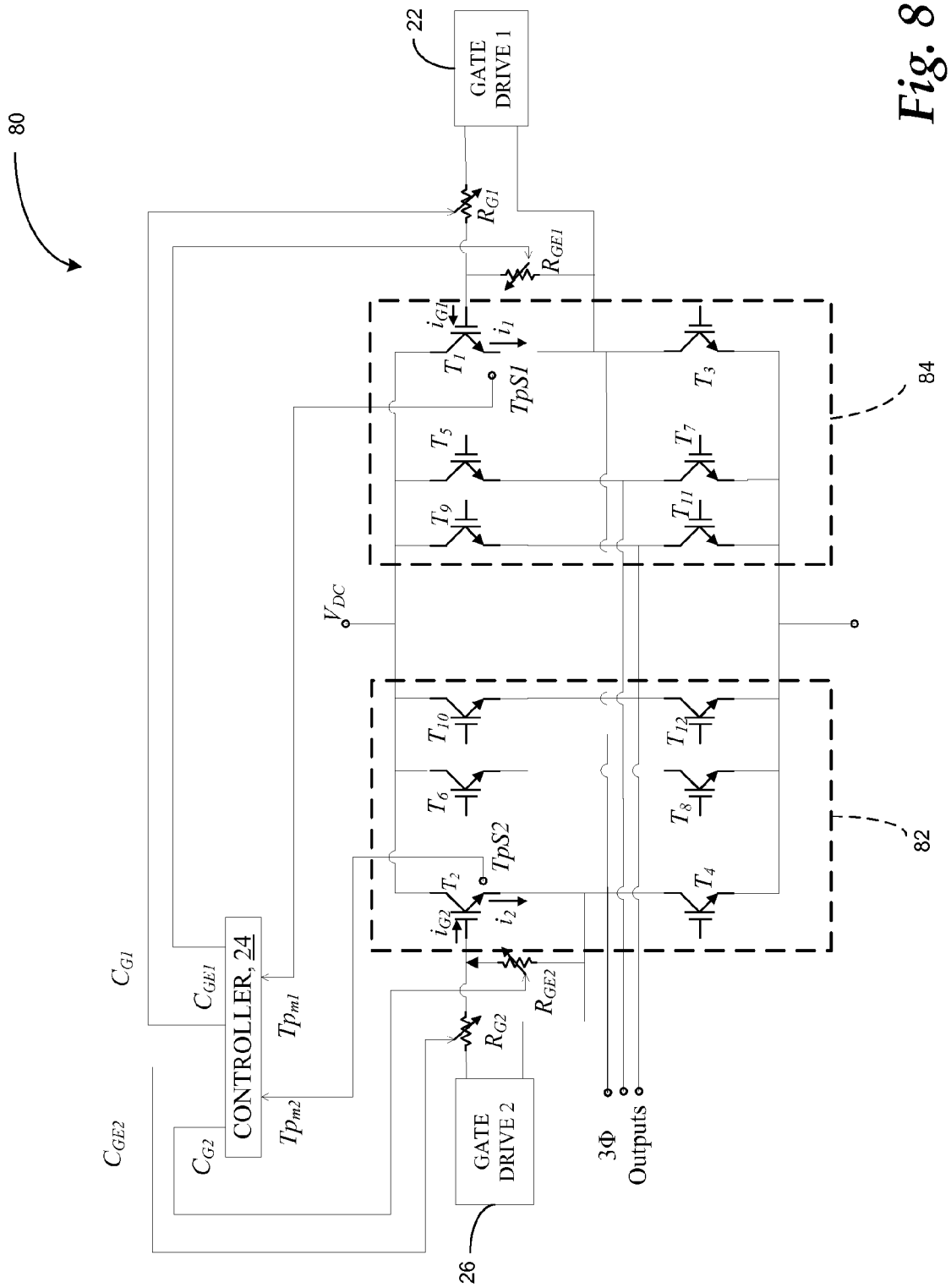
FIG. 8 illustrates one configuration of an electronic circuit with a DC input and a three phase AC output and having two parallel inverters utilizing separate gate drives and a controller for achieving equal thermal degradation according to at least one embodiment disclosed herein.

FIG. 8 illustrates one configuration of an electronic circuit 80 with two parallel inverters 82, 84 utilizing separate gate drives 22, 26 and the controller 24 for achieving equal thermal degradation of the parallel inverters 82, 84. Each inverter 82, 84 includes several transistors connected in specific configurations and may be either a boost or buck converter. Although electronic circuit 80 with inverters 82, 84 depicts only transistors $T_1$, $T_2$ operating in parallel, other pairs of transistors $T_3$, $T_4$, $T_5$, $T_6$, $T_7$, $T_8$, $T_9$, $T_{10}$, $T_{11}$ and $T_{12}$ of the inverters 82, 84 may also be operated in parallel and controlled with controller output from the controller 24 for thermally balancing of the transistor system. Also, more than two inverters may be operated in parallel.

Figure 9:
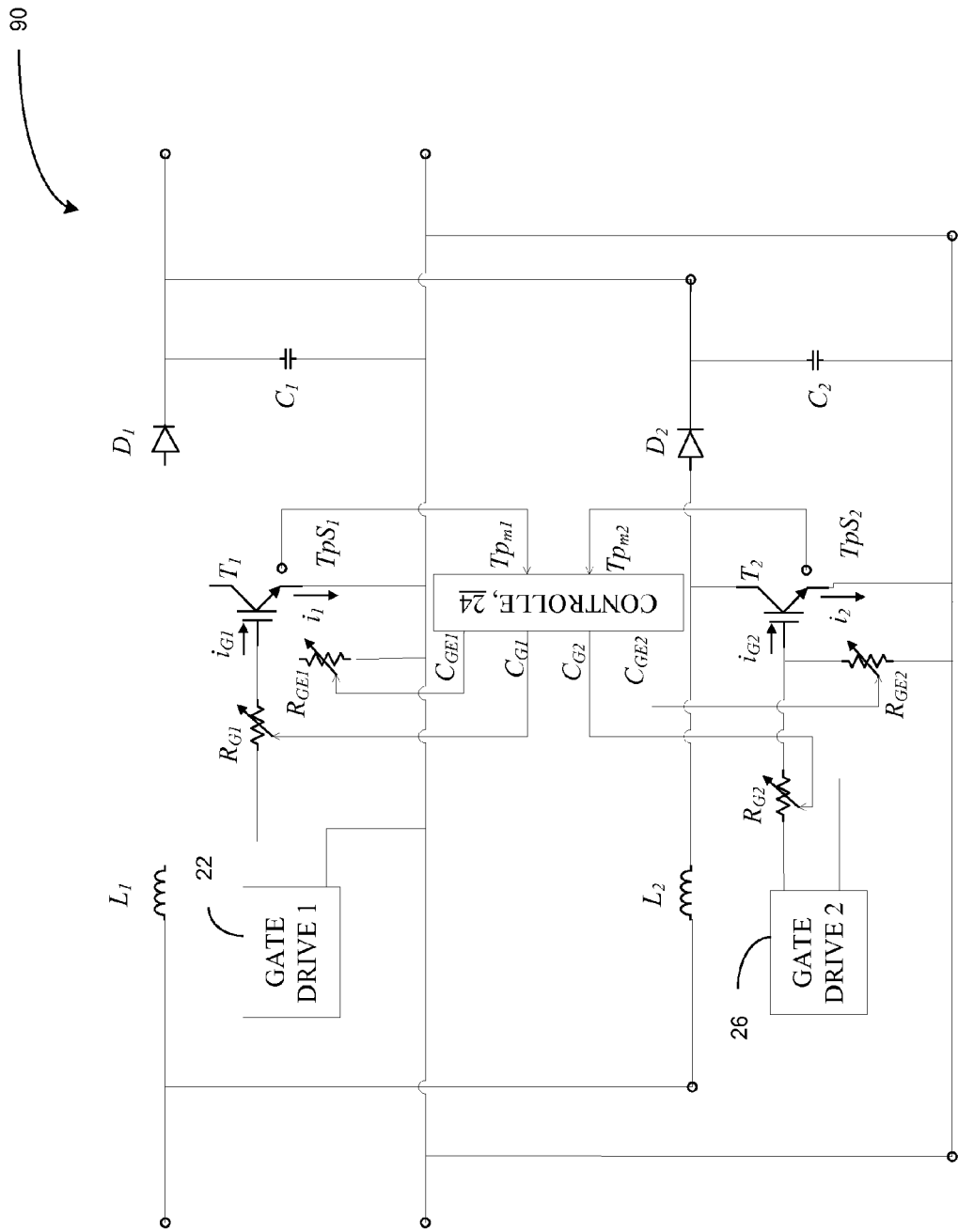
FIG. 9 illustrates one configuration of an electronic circuit with parallel DC-to-DC converters utilizing separate gate drives and a controller for achieving equal thermal degradation according to at least one embodiment disclosed herein.

FIG. 9 illustrates one configuration of an electronic diagram 90 with parallel DC-to-DC converters having capacitors $C_1$, $C_2$, inductors $L_1$, $L_2$, and diodes $D_1$, $D_2$. The parallel DC-to-DC converters utilize separate gate drives 22, 26 and the controller 24 to achieving equal thermal degradation of the parallel DC-to-DC converters. More than two DC-to-DC converters may be operated in parallel as well and be controlled with controller output from the controller 24 for thermal balancing of the DC-to-DC converters.

Figure 10:
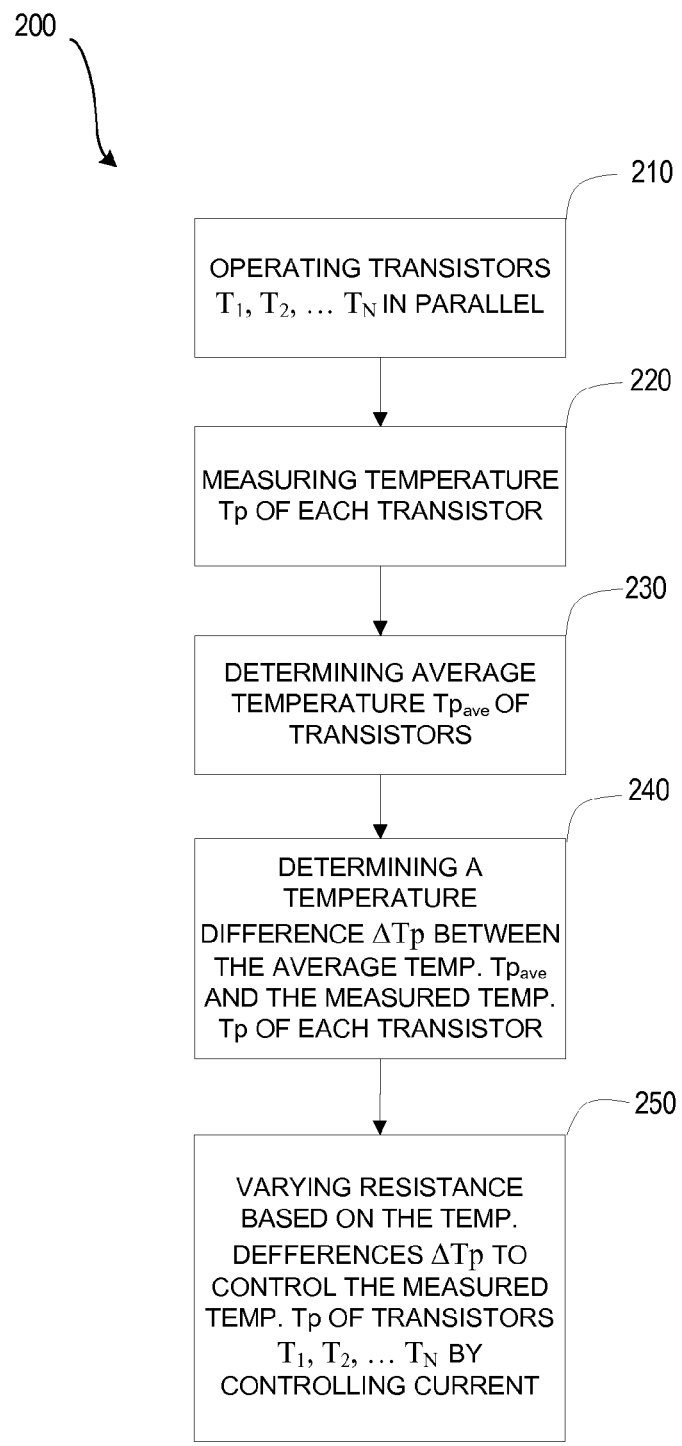
FIG. 10 illustrates one configuration of a method for prolonging and equalizing the effective life of parallel operating transistors according to at least one embodiment disclosed herein.

FIG. 10 illustrates a method 200 for prolonging and equalizing the effective life of a plurality of transistors. Unless otherwise indicated, more or fewer operations may be performed than shown in the figures and described herein. Additionally, unless otherwise indicated, these operations may also be performed in a different order than those described herein.

The method 200 starts at operation 210, where a plurality of transistors $T_1$, $T_2$, ... $T_N$ are operated in parallel. Next, in block 220 the temperature of each of the transistors $T_1$, $T_2$, ... $T_N$ is measured with a temperature sensor $TpS_1$, $TpS_2$, $TpS_N$. In block 230 the process determines an average temperature $Tp_{ave}$ of the transistors $T_1$, $T_2$, ... $T_N$ In block 240 the process determines a temperature difference $\Delta Tp$ between the average temperature $Tp_{ave}$ of the system of transistors $T_1$, $T_2$, ... $T_N$ and the measured temperature Tp of each of the transistors $T_1$, $T_2$, ... $T_N$ In process block 250 resistances $R_{G1}$, $R_{G2}$, ... $R_{GN}$, $R_{GE1}$, $R_{GE2}$, $R_{GEN}$ are varied based on the temperature differences $\Delta Tp$ to control the measured temperature Tp of each of the transistors $T_1$, $T_2$, ... $T_N$ by controlling current $i_1$, $i_2$, $i_N$ through each of the transistors $T_1$, $T_2$, ... $T_N$ thereby thermally balancing the transistors $T_1$, $T_2$, ... $T_N$.

The method 200 may also include providing controller output $C_{G1}$, $C_{GE1}$, $C_{G2}$, $C_{GE2}$, $C_{GN}$, $C_{GEN}$ based on the temperature difference of each of the transistors $T_1$, $T_2$, ... $T_N$, increasing gate resistance $R_{G1}$, $R_{G2}$, ... $R_{GN}$ to one or more of the transistors $T_1$, $T_2$, ... $T_N$ in response to the temperature difference $\Delta Tp$ being greater than zero to decrease the measured temperature Tp of each of the transistors $T_1$, $T_2$, ... $T_N$, and decreasing gate emitter resistance $R_{GE1}$, $R_{GE2}$, ... $R_{GEN}$ to the transistors $T_1$, $T_2$, ... $T_N$ in response to the temperature difference $\Delta Tp$ being greater than zero to decrease the measured temperature Tp of each of the transistors $T_1$, $T_2$, ... $T_N$.

The method 200 may also include decreasing gate resistance $R_{G1}$, $R_{G2}$, ... $R_{GN}$ to one or more of the transistors $T_1$, $T_2$, ... $T_N$ in response to the temperature difference $\Delta Tp$ being less than zero to increase the measured temperature Tp of each of the one or more transistors $T_1$, $T_2$, ... $T_N$ and increasing gate emitter resistance $R_{GE1}$, $R_{GE2}$, ... $R_{GEN}$ to one or more of the transistors $T_1$, $T_2$, ... $T_N$ in response to the temperature difference $\Delta Tp$ being less than zero to increase the measured temperature Tp of each of the one or more transistors $T_1$, $T_2$, ... $T_N$.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A electronic circuit with temperature control, comprising:
    a plurality of transistors configured to operate in parallel;
    a plurality of temperature sensors, each of the plurality of temperature sensors thermally coupled to each of the plurality of transistors for producing a temperature output signal indicative of a temperature of each of the plurality of transistors; and
    a controller for monitoring each temperature output signal of each of the plurality of temperature sensors and in response to the temperature outputs providing controller outputs to vary a gate resistance $R_G$ and a gate emitter resistance $R_{GE}$ associated with each of the plurality of transistors, wherein each gate resistance $R_G$ and each gate emitter resistance $R_{GE}$ vary current to each of the plurality of transistors respectively to thermally balance the plurality of transistors.

2. The electronic circuit of claim 1, further comprising at least one gate drive configured for supplying a drive signal to one or more of the plurality of transistors.

3. The electronic circuit of claim 2, wherein the at least one gate drive is a common gate drive configured for supplying drive signals to each of said plurality of transistors.

4. The electronic circuit of claim 2, wherein the at least one gate drive comprises separate and synchronized gate drives for supplying drive signals to each of the plurality of transistors.

5. The electronic circuit of claim 1, wherein the plurality of transistors is a two transistor system that comprises a first transistor and a second transistor, the temperature sensors comprise a first and second temperature sensor thermally coupled to the first and second transistors, respectively, wherein the controller provides controller output in response to a first temperature output signal indicative of the temperature of the first transistor and in response to a second temperature output signal indicative of the temperature of the second transistor, and wherein the controller output comprises controller outputs $C_{G1}$ and $C_{GE1}$ to vary gate resistance $R_{G1}$ and gate emitter resistance $R_{GE1}$, respectively, associated with the first transistor and further comprises controller outputs $C_{G2}$ and $C_{GE2}$ to vary gate resistance $R_{G2}$ and gate emitter resistance $R_{GE2}$, respectively, associated with the second transistor.

6. The electronic circuit of claim 1, wherein the controller output adjusts a voltage across a resistor $R_{G1}$, a voltage across a resistor $R_{GE1}$, a voltage across a resistor $R_{G2}$, and a voltage across a resistor $R_{GE2}$.

7. The electronic circuit of claim 1, wherein the controller outputs adjust a current through a resistor $R_{G1}$, a current through a resistor $R_{GE1}$, a current through a resistor $R_{G2}$, and a current through a resistor $R_{GE2}$.

8. The electronic circuit of claim 1 wherein the controller is configured to determine the temperature of each of the plurality of transistors based on the temperature outputs provide by the temperature sensors, an average temperature of the plurality of transistors based on the temperature of each of the plurality of transistors, and a temperature difference between the average temperature of each of the plurality of transistors and the temperature of each of the plurality of transistors, wherein the controller outputs are provided based on the temperature difference of each of the plurality of transistors.

9. The electronic circuit of claim 1, wherein the temperature of each of the plurality of transistors is substantially the same, and wherein the current conducted by each of the plurality of transistors is different to thermally balance the plurality of transistors.

10. The electronic circuit of claim 1, wherein the controller is configured to increase the gate resistance to one or more of the plurality of transistors in response to a temperature difference being greater than zero to decrease the temperature of the one or more plurality of transistors.

11. The electronic circuit of claim 10, wherein the controller is configured to decrease the gate emitter resistance to one or more of the plurality of transistors in response to the temperature difference being greater than zero to decrease the temperature of the one or more of the plurality of transistors.

12. The electronic circuit of claim 1, wherein the controller is configured to decrease the gate resistance to one or more of the plurality of transistors in response to a temperature difference being less than zero to increase the temperature of the one or more of the plurality of transistors.

13. The electronic circuit of claim 12, wherein the controller is configured to increase the gate emitter resistance to one or more of the plurality of transistors in response to the temperature difference being less than zero to increase the temperature of the one or more of the plurality of transistors.

14. The electronic circuit of claim 1, wherein the plurality of transistors is thermally balanced and current unbalanced.

15. The electronic circuit of claim 1, wherein a portion of the plurality of transistors correspond with a first inverter and another portion of the plurality of transistors correspond with a second inverter, wherein the first inverter and the second inverter are configured for parallel operation and at least one transistor of the first inverter is configured to operate in parallel with at least one transistor of the second inverter.

16. The electronic circuit of claim 1, wherein a portion of the plurality of transistors correspond with a first DC-to-DC converter and another portion of the plurality of transistors correspond with a second DC-to-DC converter, wherein the first and second DC-to-DC converters are configured for parallel operation and at least one transistor of the first DC-to-DC converter is configured to operate in parallel with at least one transistor of the second DC-to-DC converter.

17. A two transistor system with temperature control comprising:
a first transistor and a second transistor configured to operate in parallel;
a first temperature sensor and a second temperature sensor, the first temperature sensor thermally coupled to the first transistor for producing a first temperature output signal indicative of a first measured temperature of the first transistor, and the second temperature sensor thermally coupled to the second transistor for producing a second temperature output signal indicative of a second measured temperature of the second transistor; and
a controller for monitoring the first and second temperature outputs and in response to the first and second temperature outputs providing controller outputs to vary a first gate resistance $R_{G1}$ and a first gate emitter resistance $R_{GE1}$ associated with the first transistor and to vary a second gate resistance $R_{G2}$ and a second gate emitter resistance $R_{GE2}$ associated with the second transistor, wherein the first gate resistance $R_{G1}$ and the first gate emitter resistance $R_{GE1}$ vary current to the first transistor and the second gate resistance $R_{G2}$ and the second gate emitter resistance $R_{GE2}$ vary current to the second transistor to thermally balance the first and second transistors.

18. The two transistor system of claim 17 wherein the controller is configured to determine an average temperature of each of the first and second transistors based on the first and second measured temperatures of the first and second transistors and to determine a temperature difference between the average temperature of the first and second transistors and the first and second measured temperatures of the first and second transistors, wherein the controller outputs are provided based on the temperature difference of each of the first and second transistors.

19. The two transistor system of claim 17, further comprising separate and synchronized gate drives for supplying drive signals to the first and second transistors.

20. The two transistor system of claim 17, wherein the controller is configured to increase the first and second gate resistances $R_{G1}$, $R_{G2}$ to the first and second transistors in response to a temperature difference being greater than zero to decrease the first and second measured temperatures of the first and second transistors, and wherein the controller is further configured to decrease the first and second gate emitter resistances $R_{GE1}$, $R_{GE2}$ to the first and second transistors in response to the temperature difference being greater than zero to decrease the first and second measured temperatures of the first and second transistors.

21. The two transistor system of claim 17, wherein the controller is configured to decrease the first and second gate resistances $R_{G1}$, $R_{G2}$ to the first and second transistors in response to a temperature difference being less than zero to increase the first and second measured temperatures of the first and second transistors, and wherein the controller is further configured to increase the first and second gate emitter resistances $R_{GE1}$, $R_{GE2}$ to the first and second transistors in response to the temperature difference being less than zero to increase the first and second measured temperatures of the first and second transistors.

22. A method for prolonging and equalizing the effective life of a plurality of transistors, comprising:
operating a plurality of transistors in parallel;

measuring a measured temperature of each of the plurality of transistors with a temperature sensor;

determining an average temperature of the plurality of transistors;

determining a temperature difference between the average temperature of the plurality of transistors and the measured temperature of each of the plurality of transistors;

varying resistance based on the temperature differences to control the measured temperature of each of the plurality of transistors by controlling current through each of the plurality of transistors, thereby thermally balancing the plurality of transistors; and increasing gate resistance to one or more of the plurality of transistors in response to the temperature difference being greater than zero to decrease the measured temperature of the one or more plurality of transistors.

23. The method of claim 22 further comprising providing controller output based on the temperature difference of each of the plurality of transistors.

24. The method of claim 22, further comprising decreasing gate emitter resistance to one or more of the plurality of transistors in response to the temperature difference being greater than zero to decrease the measured temperature of the one or more of the plurality of transistors.

25. The method of claim 22, further comprising increasing gate emitter resistance to one or more of the plurality of transistors in response to the temperature difference being less than zero to increase the measured temperature of the one or more of the plurality of transistors.

26. A method for prolonging and equalizing the effective life of a plurality of transistors, comprising:

operating a plurality of transistors in parallel;

measuring a measured temperature of each of the plurality of transistors with a temperature sensor;

determining an average temperature of the plurality of transistors;

determining a temperature difference between the average temperature of the plurality of transistors and the measured temperature of each of the plurality of transistors;

varying resistance based on the temperature differences to control the measured temperature of each of the plurality of transistors by controlling current through each of the plurality of transistors, thereby thermally balancing the plurality of transistors; and decreasing gate resistance to one or more of the plurality of transistors in response to the temperature difference being less than zero to increase the measured temperature of the one or more of the plurality of transistors.

* * * * *